US006944559B2

(12) United States Patent
Hiltner

(10) Patent No.: US 6,944,559 B2
(45) Date of Patent: Sep. 13, 2005

(54) CHANNEL ISOLATION BY SWITCHED GROUNDS

(75) Inventor: David F. Hiltner, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 60 days.

(21) Appl. No.: 10/661,309

(22) Filed: Sep. 12, 2003

(65) Prior Publication Data

US 2004/0102909 A1 May 27, 2004

Related U.S. Application Data

(60) Provisional application No. 60/428,494, filed on Nov. 22, 2002.

(51) Int. Cl.[7] ............................ G06F 19/00; H02H 3/00

(52) U.S. Cl. .......................... 702/67; 327/76.11; 361/1; 702/65; 702/70

(58) Field of Search ............................. 702/67, 66, 69, 702/70, 73, 64, 65; 324/76.11, 76.12; 361/1

(56) References Cited

U.S. PATENT DOCUMENTS

| | | | | | |
|---|---|---|---|---|---|
| 4,375,660 A | * | 3/1983 | Tate et al. | | 361/50 |
| 4,876,520 A | | 10/1989 | Kjosness et al. | | |
| 5,250,893 A | * | 10/1993 | Gambill et al. | | 324/115 |
| 5,379,176 A | * | 1/1995 | Bacon et al. | | 361/106 |
| 5,517,154 A | * | 5/1996 | Baker et al. | | 330/59 |
| 5,594,329 A | * | 1/1997 | van Ettinger et al. | | 324/96 |
| 5,717,154 A | * | 2/1998 | Gulick | | 84/604 |
| 5,834,973 A | * | 11/1998 | Klatser et al. | | 330/126 |
| 5,986,637 A | | 11/1999 | Etheridge et al. | | |
| 6,278,596 B1 | * | 8/2001 | Simpson | | 361/42 |
| 6,487,456 B1 | * | 11/2002 | Masano et al. | | 700/11 |
| 6,538,420 B2 | * | 3/2003 | Bald et al. | | 324/114 |
| 2003/0160625 A1 | * | 8/2003 | Kaufman et al. | | 324/754 |
| 2004/0116094 A1 | * | 6/2004 | Eastwood | | 455/323 |
| 2004/0162694 A1 | * | 8/2004 | Ricca et al. | | 702/127 |

FOREIGN PATENT DOCUMENTS

| | | |
|---|---|---|
| DE | 43 14 484 A | 11/1994 |
| GB | 22 77 807 A | 11/1994 |

OTHER PUBLICATIONS

Sekel, Steve, "Making Oscilloscope Measurements More Accurate, Less Likely to Shock" R & D Magazine, Oct. 1995, XP001090956, *whole document*.

* cited by examiner

*Primary Examiner*—Patrick J. Assouad
(74) *Attorney, Agent, or Firm*—Moser, Patterson & Sheridan LLP; Francis I. Gray

(57) ABSTRACT

A signal acquisition instrument, such as an oscilloscope, having an input stage that is referenced to a user's ground is disclosed. Information gathered by the input stage is stored in a storage element powered by a floating power supply that is referenced to the user's ground. After storage, the storage element is disconnected from the floating power and from the user's ground and switched to a power supply referenced to the remainder of the system. FET switching is beneficial, and information can be stored either in an analog format or in a digital format.

20 Claims, 4 Drawing Sheets

CHANNEL ISOLATION BY SWITCHED GROUNDS

CROSS-REFERENCE TO RELATED APPLICATIONS

This patent application claims the benefit of U.S. Provisional Patent Application Ser. No. 60/428,494, filed on Nov. 22, 2002 and entitled, "MEANS FOR IMPLEMENTING ISOLATED CHANNELS," which is incorporated herein by reference in its entirety.

TECHNICAL FIELD

The present invention relates generally to signal acquisition instruments and, more specifically, to signal acquisition instruments having isolated input channels.

BACKGROUND OF THE INVENTION

Modern signal acquisition instruments typically include an analog-input section for receiving signals being acquired, an analog processor such as an amplifier or filter, a digitization system for digitizing processed analog signals, and a memory for storing the digitized signals. For example, U.S. Pat. No. 5,986,637, which issued to Etheridge et al. on Nov. 16, 1999, describes a high speed digital storage oscilloscope (DSO) having such features.

While generally successful, modern signal acquisition instruments can have problems in some applications, e.g., when acquiring signals from switched-mode power supplies, in locations with significant ground loops, or when small signals ride on large voltages. In such applications isolating the analog input stage so that it can utilize a user's ground can be beneficial. However, AC line-driven signal acquisition instruments typically must be electrically grounded relative to input AC power lines for safety and to comply with applicable electrical codes. Thus a conflict can exist between acquiring signals referenced to a user's ground and transferring the acquired information to the remainder of the signal acquisition instrument.

One approach to transferring information acquired by an isolated input stage to the remainder of an AC powered system is to use optical, capacitive, and/or inductive coupling. While such coupling can transfer analog information across grounds, this approach has problems because the gain-bandwidth product of the coupler often must be high to maintain linearity, because feedback mechanisms are generally unreliable, and because data quality is problematic. Another approach is to use optical, capacitive, and/or inductive coupling to couple digitized signals from logic referenced to the user's ground to logic referenced to the instrument's ground. However, this approach is relatively costly and complex and can require a significant amount of power.

Therefore, a new technique of coupling information gathered by an isolated input stage that is referenced to a user's ground to the remaining instrumentation that is referenced to instrument's ground would be beneficial.

SUMMARY OF INVENTION

The principles of the present invention provide for architectures, apparatuses, and methods of coupling information acquired by an isolated input stage that is referenced to a user's ground to the remainder of the system instrumentation that is referenced to an earth ground (which typically connects to the ground line of AC input power). Those principles can be implemented by acquiring signal information using an isolated input stage that is referenced to a user's ground, storing the acquired information either in an analog format or a digital format in a storage element that is powered by a floating power supply that is referenced to the user's ground, disconnecting the storage element from the floating power and the user's ground, and then connecting the storage element to a power supply referenced to the earth ground. Because of their speed and high voltage-handling capability, FET switches are useful devices for connecting and disconnecting the storage element.

In one embodiment of the invention, digital memory devices are used. In another embodiment analog memory, e.g., FISO (fast in-slow out) memory is used.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The subject invention will be primarily described within the context of a general signal acquisition instrument, and then in the context of a digital storage oscilloscopes (DSOs). It will be appreciated by those skilled in the art that the invention may be advantageously employed in many different systems where acquiring information referenced to one ground and then switching that information to another ground is desirable.

Figure 1:
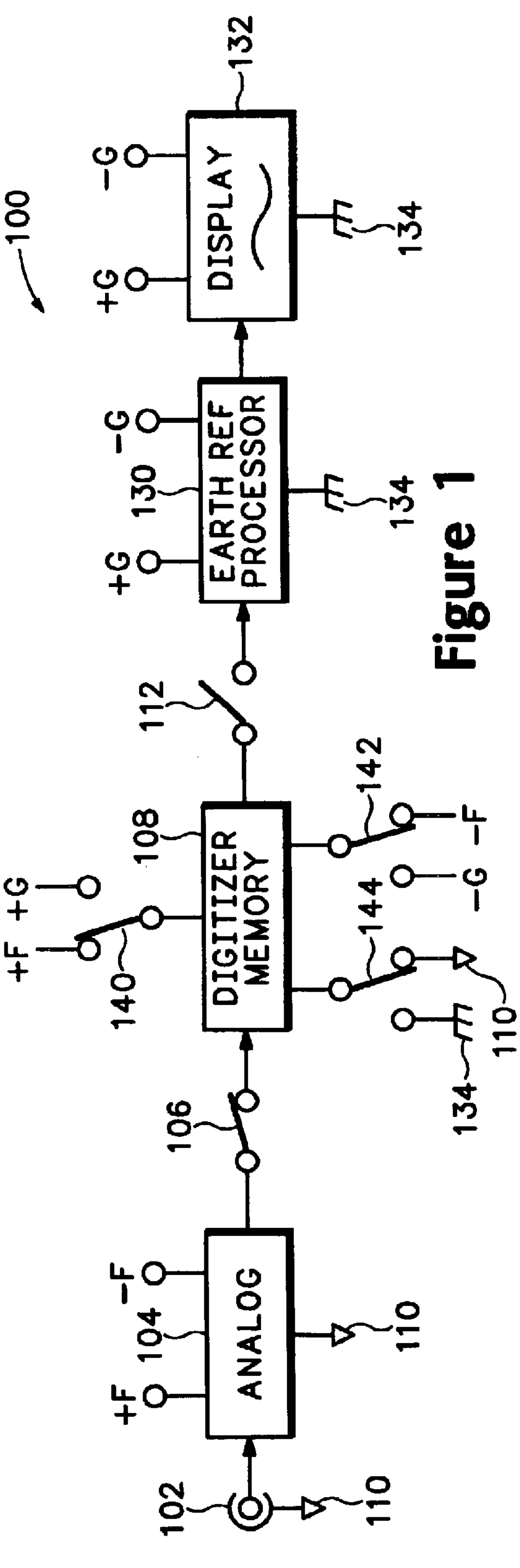
FIG. 1 depicts a high level block diagram of a signal acquisition system according to a first embodiment of the invention when that system is in a first state.

FIG. 1 depicts a high level block diagram of a signal acquisition system 100 according to an embodiment of the present invention. The signal acquisition system 100 receives at an input port 102 an input signal that is referenced to a user ground 110. The input signal is amplified and/or otherwise processed (e.g. filtered) by an analog network 104. The output of the analog network 104 is applied via a closed switch 106 to a digitizer 108 that includes a memory. The digitizer 108 is powered by +F and −F voltages from a floating power supply (not shown in FIG. 1, but see FIG. 6 for such a power supply) that is referenced to the user ground 110.

The digitizer 108 converts the analog processed signal from switch 106 into digital values that are stored in its memory. At this time the digitizer 108 output is applied to an open switch 112 (or switches). The signal acquisition device 100 further includes an earth ground 134 referenced processor 130, which is connected to the switch 112, and an earth ground 134 referenced display 132. The processor 130 and the display 132 are powered by voltages G+ and G− from an earth grounded referenced power supply (not shown in FIG. 1, but see FIG. 6 for such a power supply). For convenience all of the devices that are constantly powered by voltages G+ and G− can be generically referred to as an instrumentation network. The earth ground 134 is, in one embodiment, connected to a ground input of AC input power.

As shown in FIG. 1, the +F voltage is connected to the digitizer 108 via a switch 140, the −F voltage is connected to the digitizer 108 via a switch 142, and the user ground 110 is connected to the digitizer 108 via a switch 144. Thus, in FIG. 1 the digitizer 108 is electrically isolated from the instrumentation network. Because the input port 102 is referenced to user ground 110 the input signal is not impacted by ground loops, high voltage differentials, noise, or other factors that impact the earth ground 134. For example, the earth ground 134 will usually be shared by other devices powered by a common AC power line, and those devices can produce ground loop voltage drops that will appear on the earth ground 134.

Figure 2:
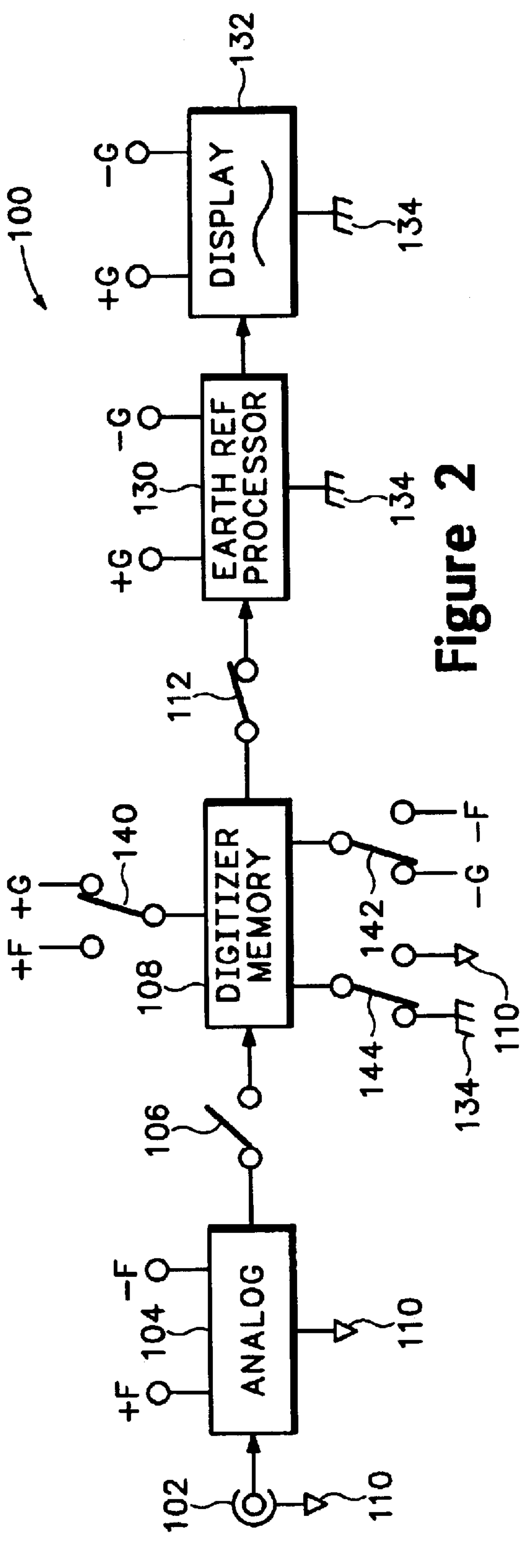
FIG. 2 depicts the signal acquisition system of FIG. 1 when that system is in a second state.

Referring now to FIG. 2, after the digitizer 108 has digitized the signal from the analog network 104, a set of switch-changes occurs. Specifically, the switch 106 opens, which disconnects the digitizer 108 from the analog network 104. Then, the switch 144 disconnects the digitizer 108 from the user ground 110 and connects it to the earth ground 134, and the switches 140 and 142 disconnect the +F and −F voltages from the digitizer 108 and connect the digitizer 108 to the +G and −G. Finally, the switch 112 closes, connecting the digitizer 108 to the processor 130.

As shown in FIG. 2, the user ground 110 is no longer connected to the digitizer 108. The switching of user ground 110 to earth-ground 134 is performed in a manner that avoids damage from differences between user and earth grounds, and thus possible damage to the input stage and/or the signal source while also providing the signal acquisition system 100 with the protection afforded by a common earth ground.

Figure 3:
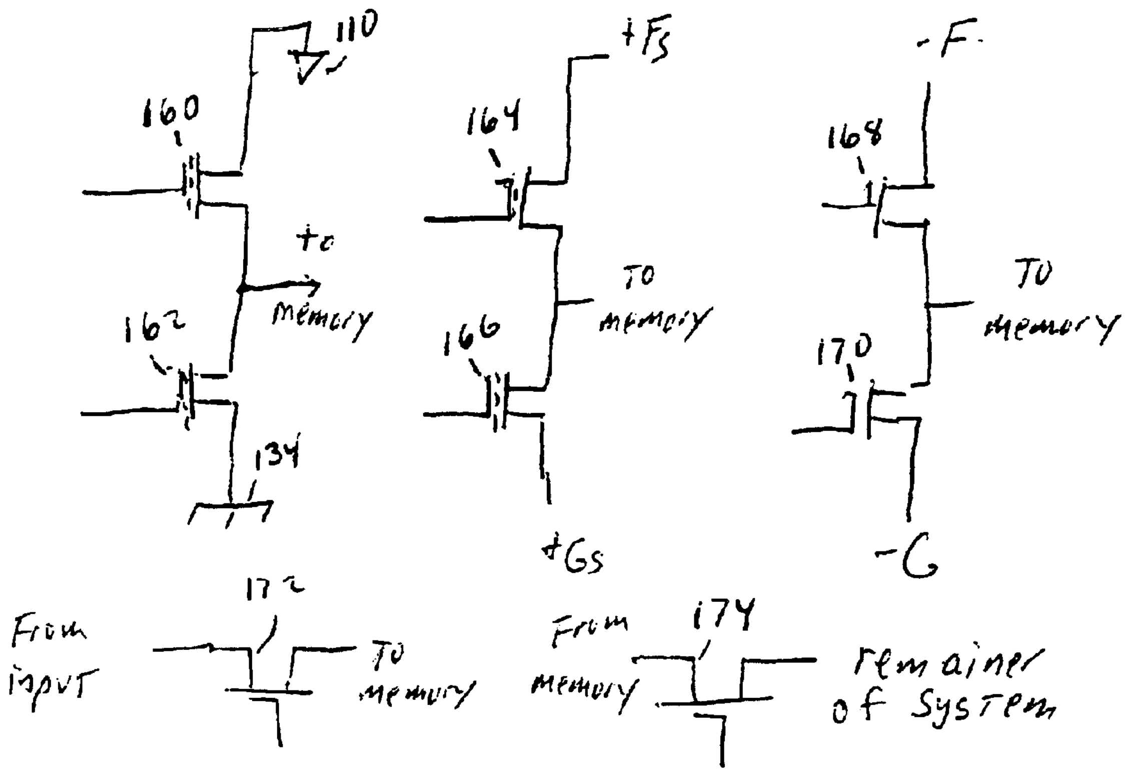
FIG. 3 illustrates the use of FET switches.

It should be noted that in various embodiments switches 140, 142, and 144 operate in a break-before-make fashion. Furthermore, while the switches 106, 112, 140, 142, and 144 are shown in FIGS. 1 and 2 as mechanical switches, in practice high voltage analog switches, e.g., bipolar transistor, FET, diodes, or any other non-linear devices, are beneficial. For example, FIG. 3 illustrates generic FET switches 160–174, which may be any type of FET such JFET, MOSFET, P-Channel, N-Channel, etc. Such FET switches are faster, more reliable, and cheaper than mechanical switches. While FET switches are a good choice, again, other types of devices can also be used. As shown in FIG. 3, switches 160 and 162 switch user ground 110 and earth ground 134, switches 164 and 166 switch +F and +G, switches 168 and 170 switch −F and −G, switch 172 switches analog inputs to memory, and switch 174 switches the output of the memory to the remainder of the system. The driving of the FET switches is controlled by logic, such as from a processor (reference FIG. 6 for a processor).

Figure 4:
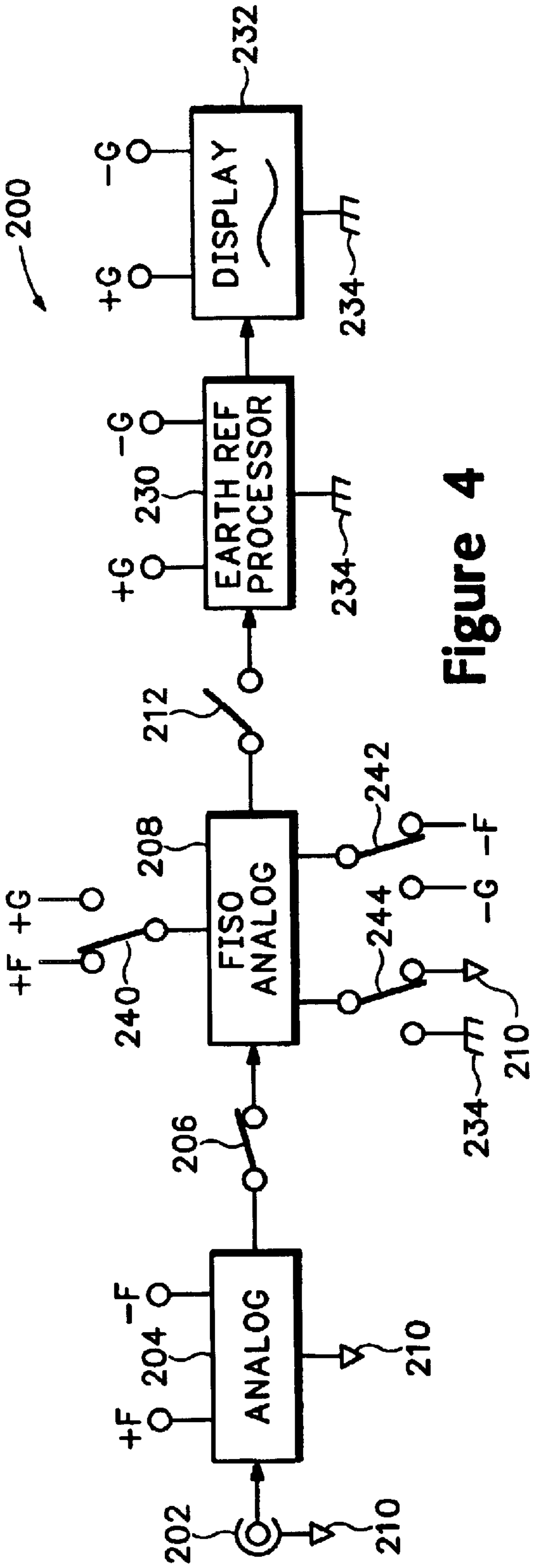
FIG. 4 depicts a high level block diagram of a signal acquisition system according to another embodiment of the invention when that system is in a first state.

While FIGS. 1 and 2 illustrate switching a user ground 110 to earth-ground 134 after the acquired signal has been digitized, this is not required. Switching of analog signals is also possible. For example, FIG. 4 depicts a high level block diagram of a signal acquisition system 200 according to a second embodiment of the present invention. The signal acquisition system 200 receives an input signal that is referenced to a user ground 210 on an input port 202. The input signal is amplified and/or otherwise processed by an analog network 204. The output of the analog network 204 is applied via a closed switch 206 to an analog fast-in-slow-out (FISO) memory 208.

As shown in FIG. 4, the FISO memory 208 is powered by +F and −F voltages from a floating power supply (which is not shown in FIG. 4, but reference FIG. 6) that is referenced to the user ground 210. The user ground 210 is also connected to the input port 202. The FISO memory 208 retains an analog version of the input signal. The output of the FISO memory 208 is applied to an open switch 212. The signal acquisition device 200 further includes an earth-referenced processor 230, which is connected to the switch 212, and a display 232. The earth-referenced processor 230 and the display 232 are referred to an earth ground 234 and are powered by +G and −G voltages from an earth-grounded power supply (which is not shown in FIG. 4, but reference FIG. 6). The devices that are continuously connected to the +G and −G voltages can be referred to as an instrumentation network.

As shown in FIG. 4, the +F voltage is connected to the FISO memory 208 via a switch 240, the −F voltage is connected to the FISO memory 208 via a switch 242, and the user ground 210 is connected to the FISO memory 208 via a switch 244. Thus, in FIG. 4 the FISO memory 208 is electrically isolated from the Earth-referenced processor 230 and the display 232. Because the analog signal input on input port 202 is referenced to user ground 210 the input signal is not impacted by ground loops, high voltage differentials, noise, or other factors that might impact the earth ground 234.

Figure 5:
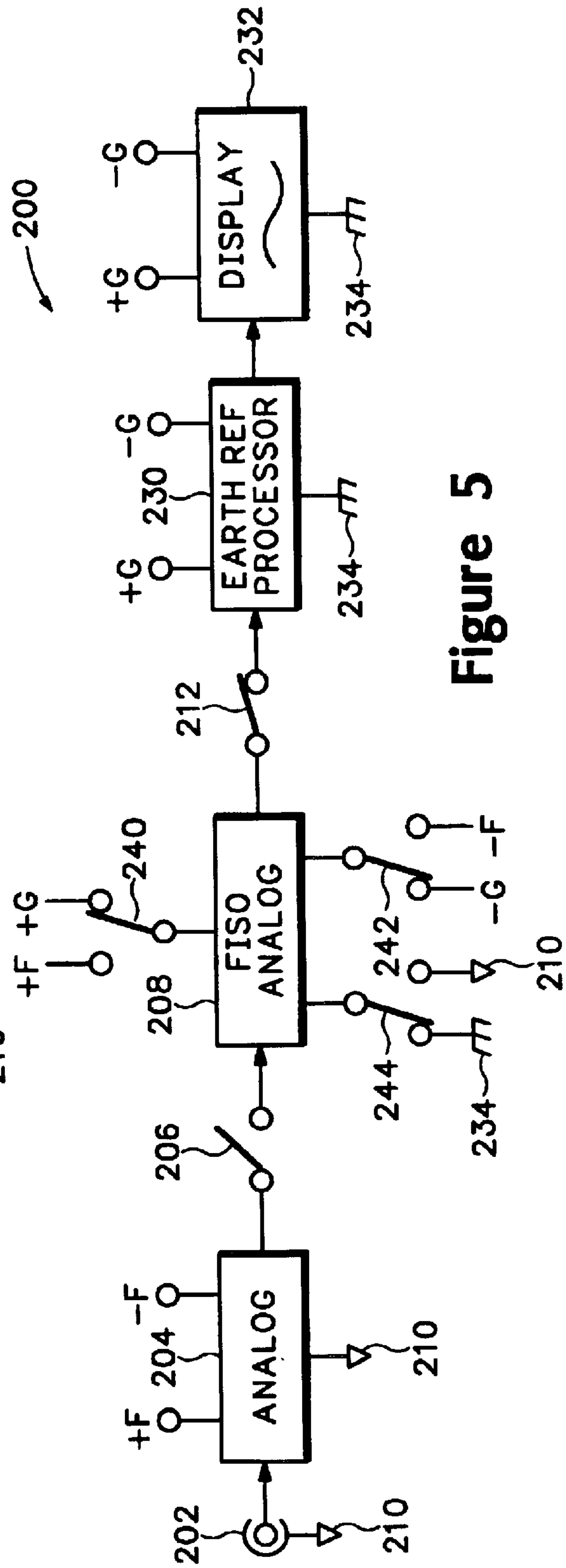
FIG. 5 depicts the signal acquisition system of FIG. 4 when that system is in a second state.

Referring now to FIG. 5, after the FISO memory 208 has captured the signal from the analog network 204, a set of switch-changes occurs. Specifically, the switch 206 opens, which disconnects the FISO memory 208 from the analog network 204. Additionally, the switch 244 switches the FISO memory 208 from the user ground 210 to the earth ground 234. At the same time, the switches 240 and 242 switch the FISO memory 208 from the +F and −F voltages to the +G and −G voltages. Finally, the switch 212 closes, connecting the FISO memory 208 to the earth-referenced processor 230.

As in the embodiments illustrated in FIGS. 1 and 2, the switches 240, 242, and 244 operate in a break-before-make fashion and all switches are beneficially high voltage analog (FET) switches (see FIG. 3). If bipolar transistor switches are used DC level changes might have to be corrected for.

Figure 6:
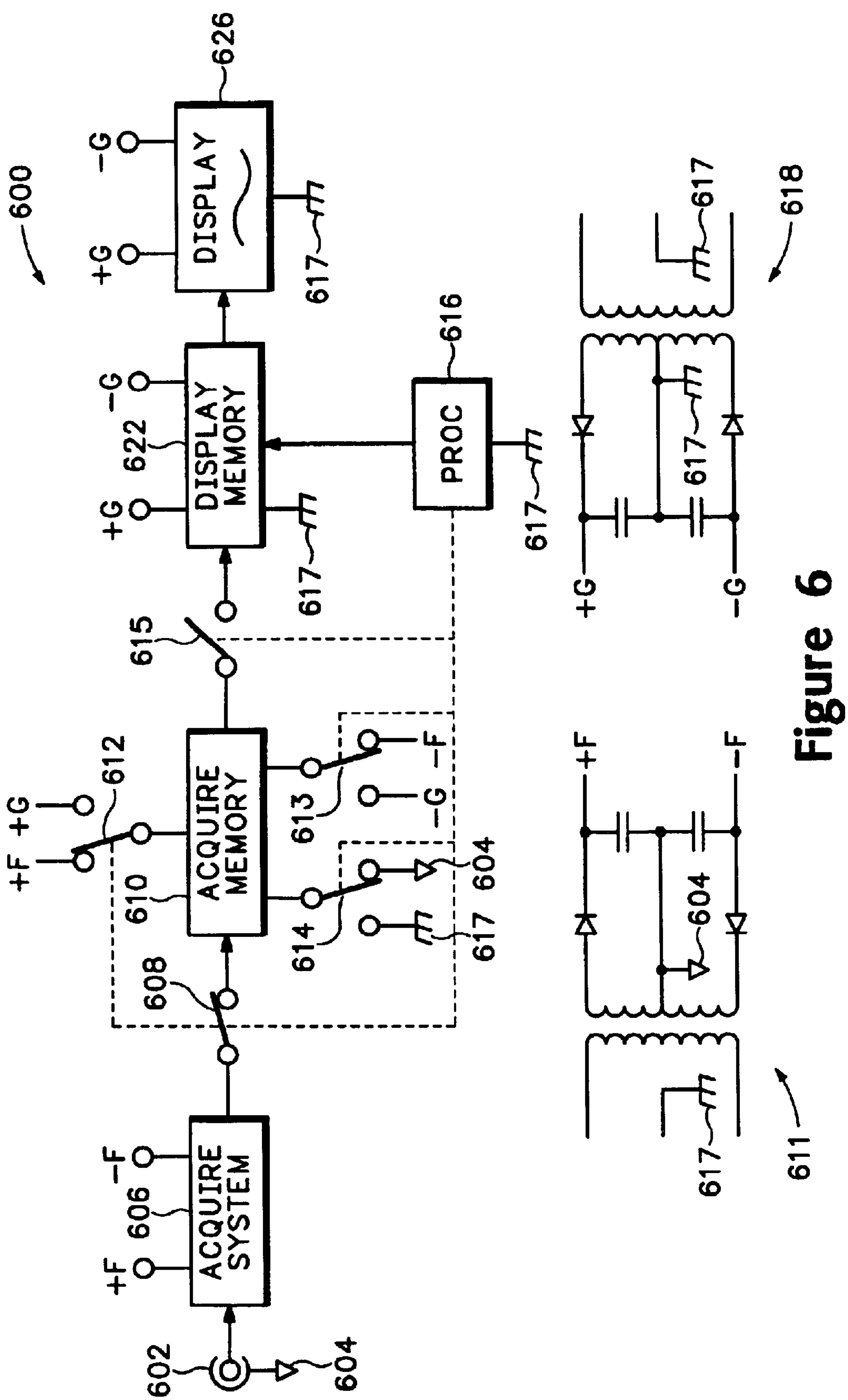
FIG. 6 depicts a block diagram of an oscilloscope that incorporates the principles of the present invention.

FIGS. 1 through 5 illustrate generic signal acquisition systems 100 and 200 that can be used for many purposes in many different systems. However, such signal acquisition systems are particularly useful in oscilloscopes. For example, FIG. 6 illustrates a block diagram of an oscilloscope 600 that benefits from the principles of the present invention. As shown, the oscilloscope 600 includes an input 602 that is referenced to a user ground 604. A signal on the input 602 is passed to an acquisition system 606. The acquisition system 606 includes a user-selectable gain amplifier and an analog-to-digital converter (ADC). The ADC of the acquisition system 606 samples and quantizes the amplified signal and supplies the acquired information via closed switch 608 to an acquisition memory 610. It is also possible for the acquisition system 606 to store an analog representation of the input signal in a FISO memory. However, for convenience, the oscilloscope 600 will be assumed to use an ADC and a digital memory. During data acquisition, and as shown in FIG. 6, the acquisition memory 610 is powered by +F and −F voltages from a floating power supply 611 that is referenced to user ground 604. The +F and −F voltages are applied via switches 612 and 613, respectively, and the user ground 604 is applied by a switch 614. It should be understood that the acquisition system 606 is directly powered by the floating power supply 611 and is directly wired to the user ground 604. The output of the acquisition memory 610 is applied to a switch 615 which is open during data acquisition.

After data acquisition is complete, a processor 616 causes the switch 608 to open and switch 615 to close. Contemporaneously, the processor 616 also causes switches 612, 613, and 614 to switch such that the acquisition memory 610 is powered by +G and −G voltage from an earth ground 617 power supply 618 and such that the acquisition memory 610 is connected to earth ground 617.

With switch 615 closed, the output of the acquisition memory 610 passes to a display memory 622 that stores the acquisition memory 610 output. The contents of the display memory 622 are employed to generate a waveform display on a raster scan display device 626. The processor 616 may provide additional information, such as the amplification factor and a waveform time-base to the display memory 622 for display. After the display memory 622 has stored the output of the acquisition memory 610 the processor 616 causes switch 615 to open and switch 608 to close. Additionally, the processor 616 causes switches 612, 613, and 614 to connect the acquisition memory 610 back to the floating power supply 611 voltages +F and −F and to the user ground 604. It should be understood that the earth grounded power supply 618 supplies power to the display 626, to the processor 618 and to the display memory 622. Furthermore, the processor 616 causes the various switches to switch in a break-before-make fashion. In one embodiment, instead of mechanical switches high-voltage FET switches are used (see FIG. 3). All devices that are directly connected to the earth grounded power supply 618 and to earth ground 617 can be generically referred to as an instrumentation network.

While the foregoing is directed to the preferred embodiment of the present invention, other and further embodiments of the invention may be devised without departing from the basic scope thereof, and the scope thereof is determined by the claims that follow.

What is claimed is:

1. A signal acquisition instrument, comprising:

an input stage referenced to a first ground, said input stage for receiving an input signal;

a memory for storing information related to said input signal;

an instrumentation network referenced to a second ground, said instrumentation network for processing information from said memory; and a switch network having at least two switches for selectively switching said memory between said first and second grounds;

wherein said first and second grounds are electrically isolated.

2. The signal acquisition instrument of claim 1 wherein said switch network includes at least one semiconductor switch.

3. The signal acquisition instrument of claim 1 wherein at least one switch is a break-before-make switch.

4. The signal acquisition instrument of claim 1 wherein said switch network selectively connects said memory to said input stage.

5. The signal acquisition instrument of claim 1 wherein said switch network selectively connects said memory to said instrumentation network.

6. The signal acquisition instrument of claim 1 wherein said memory is a digital memory.

7. The signal acquisition instrument of claim 1 wherein said memory is an analog memory.

8. The signal acquisition instrument of claim 1 wherein said an instrument network includes a display.

9. The signal acquisition instrument of claim 1 wherein said second ground is electrically connected to an AC power ground line.

10. An oscilloscope, comprising:

an input stage referenced to a first ground, said input stage or receiving an input signal;

a memory for storing information related to said input signal;

an instrumentation network referenced to a second ground, said instrumentation network for processing information from said memory;

a display for displaying a waveform representation of said input signal; and a switch network having at least two switches for selectively switching said memory between said first ground and said second ground;

wherein said first and second grounds are electrically isolate.

11. The oscilloscope of claim 10 wherein said switch network includes at least one semiconductor switch.

12. The oscilloscope of claim 10 wherein at least one switch is a break-before-make switch.

13. The oscilloscope of claim 10 wherein said switch network selectively connects said memory to said input stage.

14. The oscilloscope of claim 10 wherein said switch network selectively connects said memory to said instrumentation network.

15. The oscilloscope of claim 10 wherein said memory is a digital memory.

16. The oscilloscope of claim 10 wherein said memory is an analog memory.

17. The oscilloscope of claim 10 wherein said oscilloscope is a digital storage oscilloscope.

18. The oscilloscope of claim 10 wherein said second ground is electrically connected to an AC power ground line.

19. A method of acquiring a signal comprising:

receiving a signal referenced to a first ground;

storing information about the received signal in a memory referenced to the first ground;

disconnecting the memory from the first ground;

referencing the memory to a second ground, the first and second grounds being electrically isolated; and processing the stored information using a system referenced to the second ground.

20. The method of claim 19 further including the step of displaying a waveform representation of the received signal.

* * * * *